United States Patent
Yang et al.

(10) Patent No.: US 9,269,857 B2
(45) Date of Patent: Feb. 23, 2016

(54) METHOD AND SYSTEM FOR ELIMINATING YELLOW RING OCCURRING ON WHITE LIGHT EMITTING DIODE

(71) Applicant: NATIONAL APPLIED RESEARCH LABORATORIES, Taipei (TW)

(72) Inventors: Ching-Ching Yang, Taipei (TW); Hsin-Yi Tsai, Taipei (TW); Yi-Ju Chen, Taipei (TW); Kuo-Cheng Huang, Taipei (TW)

(73) Assignee: NATIONAL APPLIED RESEARCH LABORATORIES, Taipei (TW)

( * ) Notice: Subject to any disclaimer, the term of this patent is extended or adjusted under 35 U.S.C. 154(b) by 317 days.

(21) Appl. No.: 14/060,593

(22) Filed: Oct. 22, 2013

(65) Prior Publication Data

US 2015/0111319 A1      Apr. 23, 2015

(51) Int. Cl.
*H01L 21/66*     (2006.01)
*H01L 33/00*     (2010.01)
*B23K 26/03*     (2006.01)
*H01L 33/54*     (2010.01)

(52) U.S. Cl.
CPC .......... *H01L 33/0095* (2013.01); *B23K 26/032* (2013.01); *B23K 26/082* (2015.10); *H01L 33/54* (2013.01); *H01L 2933/0091* (2013.01)

(58) Field of Classification Search
CPC ................... H01L 2924/0002; H01L 2924/00; H01L 23/5258; H01L 21/76894; H01L 21/3065; H01L 21/30655; H01L 21/67207; H01L 21/78; H01L 21/486; H01L 2924/09701; H01L 21/268; B23K 26/04; B23K 26/0624
See application file for complete search history.

(56) References Cited

U.S. PATENT DOCUMENTS

| | | | | |
|---|---|---|---|---|
| 8,846,172 | B2 * | 9/2014 | Nakamura | B32B 18/00 428/43 |
| 2009/0212697 | A1 * | 8/2009 | Nakamura | B82Y 30/00 313/506 |
| 2013/0341666 | A1 * | 12/2013 | Yoshida | H01L 33/501 257/98 |
| 2015/0089751 | A1 * | 4/2015 | Landa | B65D 1/0223 8/406 |

* cited by examiner

*Primary Examiner* — Robert Bachner
(74) *Attorney, Agent, or Firm* — Chih Feng Yeh; Huntington IPConsulting Co., Ltd

(57) ABSTRACT

Disclosed are a method and system for eliminating yellow ring phenomenon occurring on the white light emitting diode (LED) based on a blue light chip exciting yellow phosphor powders and having a packaging surface enclosing thereon. Lightspot images are repeatedly acquired outside the white LED, and then each analyzed to see if the yellow ring still exists on a lightspot. If yes, a further atomization process is performed on the packaging surface of white LED, until the acquired and analyzed image shows no yellow ring exists. A lightspot-by-lightspot basis is used in the yellow ring elimination task. In the image analysis, a look up table may be provided in advanced or established at the same time simultaneously with the yellow ring elimination task. The atomization performed on the lightspot may also consider a width issue.

16 Claims, 7 Drawing Sheets

METHOD AND SYSTEM FOR ELIMINATING YELLOW RING OCCURRING ON WHITE LIGHT EMITTING DIODE

BACKGROUND OF THE INVENTION

1. Field of Invention

The present invention relates to an elimination technique of yellow ring occurring on a white light emitting diode (LED). Particularly, the present invention relates to a method and system for eliminating yellow ring occurring on the white LED having a blue light chip exciting yellow phosphor powders and having a packaging surface enclosing thereon.

2. Related Art

Light emitting diodes (LEDs) have been widely used in many applications, such as general lightening, traffic light and displays, due to its low cost, high illumination and energy saving characteristics. Many attentions are drawn that, after white LEDs are developed successfully, human life have been largely promoted and facilitated.

Traditionally, a LED is presented by employing the policy of a mixture of light emitting from a red, green and blue light chip, a blue light chip exciting red and green phosphor powders, and a blue chip exciting yellow phosphor powders, respectively. Among them, the structure of using a blue light chip and yellow phosphor is the most attractive one owing to its simple and cost saving.

However, a yellow ring phenomenon of the lightspots has been generally observed around the kind of white LED having a blue light chip exciting yellow phosphor powders. It is presented because the yellow phosphor powders are not properly dispensed on a uniform arrangement within the packaging surface. In this regard, solutions for such elimination of such yellow ring phenomenon have been proposed hotly.

One solution disclosed a LED packaging structure, in which a phosphor layer is provided for a white light with the phosphor powders contained therein arranged in a particular pattern for reduction of the yellow ring phenomenon. Another solution taught a LED optical lens, where a lens body is provided to have a particular design so that uniformity of the LED illumination arrangement and angle is improved. And another solution suggested a LED packaging structure capable of wide angle and uniform outputting light, in such a manner that the light attenuation issue and secondary packaging issue may be improved and eliminated, respectively.

Also, another prior technology taught a LED based lamp, in which a lens and microlenses each being in a polygonal shape are provided so that the emitted light may be directed to the microlenses through the lens to achieve good light scattering effect. Another solution suggested a LED assembly, where a filter layer is provided to let the LED light with a particular wavelength at least partially reflected, to reduce the yellow ring phenomenon. Another prior art disclosed a LED having at least a porous ceramic element for light scattering. And still other solution proposed a LED with a phosphor coating, in which a dye compound is contained to improve the uniformity of the light distribution pattern viewed externally to the device.

All the prior arts discussed in the above are each presented with a secondary optical element, which has been observed with some shortcomings. For example, the cost for the whole LED structure for elimination of the yellow ring phenomenon may be not low enough, the applicability to all kinds of white LED products is impossible, and the secondary optical elements may have the chance of failure in the real use.

In view of the above discussed issues encountered in the prior art, the inventor of this application suggests a method and system for eliminating yellow ring occurring on the white LED having a blue light chip exciting yellow phosphor powders and having a packaging surface enclosing thereon on a lightspot by lightspot basis, which is performed at a place other than within the packaging surface.

SUMMARY OF THE INVENTION

It is, therefore, an object to provide a method and system for eliminating yellow ring occurring on the white light emitting diode (LED) having a blue light chip exciting yellow phosphor powders and having a packaging surface enclosing thereon.

To achieve the object of the present invention, the method of for eliminating a yellow ring phenomenon occurring on a plurality of lightspots of a white light emitting diode (LED) having a blue light chip exciting a plurality of yellow phosphor powders and having a packaging surface thereon, comprising steps of: (a) acquiring a lightspot image of a lightspot outside the packaging surface of the white LED; (b) analyzing the lightspot image; (c) looking for a coarse degree required and corresponding to the lightspot image from a look-up table having a relationship between a plurality of lightspot images and a plurality of coarse degrees corresponding thereto; (d) launching an atomization process on the packaging surface of white LED according to the coarse degree corresponding to the lightspot image; (e) determining if the lightspot is a final one among the plurality of lightspots, and going back to step (a) with respect to a next one among the plurality of lightspots if the lightspot is determined as an intermediate lightspot; and (f) ending up the method if the lightspot is determined as the final lightspot.

In an embodiment, the plurality of lightspot images and the plurality of coarse degree corresponding thereto are all null in the look-up table, and the step (c) further comprises steps of: determining if the lightspot image has the coarse degree corresponding thereto being found or if the lightspot image is new to the look-up table; continuing the method to the step (d) if the lightspot image is found with the coarse degree corresponding thereto; launching a single atomization action on the lightspot if the lightspot image is new to the look-up table and recording the coarse degree corresponding to the single atomization; going back to the step (b) if the lightspot image is still new to the look-up table; performing the step (d) if the lightspot image is found with the coarse degree corresponding thereto and recording the lightspot image and a total coarse degree accumulated from the one or more times of single atomization actions as performed as a relationship pair into the look-up table.

In an embodiment, the method further comprises a step (a1) before the step (a) of: launching a pre-atomization action on the lightspot equivalent to the lightspot in the step (a).

In an embodiment, the step (b) further comprises steps of: acquiring an intensity of each of a plurality of dots in the lightspot image; and calculating the intensity of each of the plurality of points in the lightspot image as a first yellow ring index; and the step (c) further comprises a step of looking for the coarse degree required and corresponding to the yellow ring information including the first yellow ring index from the look-up table.

In the step (b) further comprises a step of acquiring a width of the yellow ring information as a second yellow ring index; and the step (d) further comprises a step of launching the atomization process according to the coarse degree corresponding to the yellow ring information including the second yellow ring index.

In an embodiment, the analyzing unit further comprises a width acquiring unit, acquiring a width of the lightspot image as an atomization width; and the atomization process unit further comprises a width-based atomization process unit, launching the atomization process according to the coarse degree corresponding to the lightspot image and the atomization width.

In an embodiment, the atomization action and process are each enabled by a laser, and the coarse degree associated with the atomization action is adjustable by controlling a scanning speed and energy of the laser.

In an embodiment, the laser has a focusing point controlled by a stepping motor.

In an embodiment, the look-up table is established based on an experiment process.

In the present invention, the system for eliminating a yellow ring phenomenon occurring on a plurality of lightspots of a white light emitting diode (LED) having a blue light chip exciting a plurality of yellow phosphor powders and having a packaging surface thereon, comprises: an image acquiring unit, acquiring a lightspot image of one of the plurality of lightspots outside the packaging surface of the white LED; an analyzing unit, analyzing the lightspot image; a look-up unit, looking for a coarse degree required and corresponding to the lightspot image from a look-up table having a relationship between a plurality of lightspot images and coarse degrees corresponding thereto; an atomization process unit, launching an atomization process on the lightspot according to the coarse degree corresponding to the lightspot image; a final lightspot determination unit, determining if the lightspot is a final one among the plurality of lightspots and directing the image acquiring unit to acquire the lightspot image with respect to a next one among the plurality of lightspots if the lightspot is determined as an intermediate lightspot; and an end-up unit, ending up the method if the lightspot is determined as the final lightspot.

In an embodiment, the plurality of lightspot images and the plurality of coarse degree corresponding thereto are all null in the look-up table, and the look-up unit further comprises: a data existing determination unit, determining if the lightspot image has the coarse degree corresponding thereto being found or if the lightspot image is new to the look-up table, and directing the final lightspot determination unit to determine if the lightspot is the final lightspot if the lightspot image is found with the coarse degree corresponding thereto; a single atomization unit, launching a single atomization action on the packaging surface of white LED if the lightspot image is new to the look-up table and recording the coarse degree corresponding to the single atomization, while directing the analyzing unit to analyze the lightspot image if the lightspot image is still new to the look-up table; and an atomization and recording unit, directing the atomization process unit to launch the atomization process if the lightspot image is found with the coarse degree corresponding thereto and recording the lightspot image and a total coarse degree accumulated from the one or more times of single atomization actions as performed as a relationship pair into the look-up table.

In an embodiment, the system further comprises a pre-atomization action unit for launching a pre-atomization action on the packaging surface of white LED equivalent to the lightspot processed in the image acquiring unit.

In an embodiment, the analyzing unit further comprises a dot intensity acquiring unit, acquiring an intensity of each of a plurality of dots in the-lightspot image, and an intensity calculating unit, calculating the intensity of each of the plurality of dots in the lightspot image as a first yellow ring index; and the look-up unit further comprises an index-based look-up unit, looking for the coarse degree required and corresponding to the yellow ring information having the first yellow ring index from the look-up table.

In an embodiment, the analyzing unit further comprises a width acquiring unit, acquiring a width of the lightspot image as a second yellow ring index; and the atomization process unit further comprises a width-based atomization process unit, launching the atomization process according to the coarse degree corresponding to the yellow ring information including the second lightspot image.

In an embodiment, the atomization action and process are each enabled by a laser, and the coarse degree associated with the atomization action is adjustable by controlling a scanning speed and energy of the laser.

In an embodiment, the laser has a focusing point controlled by a stepping motor.

In an embodiment, the look-up table is established based on an experiment process.

It is, therefore, an advantage of the present invention to provide a method and system for eliminating a yellow ring occurring on a white LED of such kind, which can provide a service for the manufacturers whoever desires to eliminate the yellow ring phenomenon of their white LED products.

Another advantage of the present invention is to provide a method and system for eliminating a yellow ring occurring on a white LED of such kind, which can have a reduced cost in elimination of the yellow ring phenomenon, as compared to the implementation of the conventional secondary optical elements.

Yet another advantage of the present invention is to provide a method and system for eliminating a yellow ring occurring on a white LED of such kind, which can be applied onto all kinds of white LED products.

Still another advantage of the present invention is to provide a method and system for eliminating a yellow ring occurring on a white LED of such kind, which can be guaranteed to take effect in a yellow ring elimination task.

BRIEF DESCRIPTION OF THE DRAWINGS

The invention will become more fully understood from the detailed description given herein below illustration only, and thus is not limitative of the present invention, and wherein.

DETAILED DESCRIPTION OF THE INVENTION

The present invention will be apparent from the following detailed description, which proceeds with reference to the accompanying drawings, wherein the same references relate to the same elements.

Figure 1:
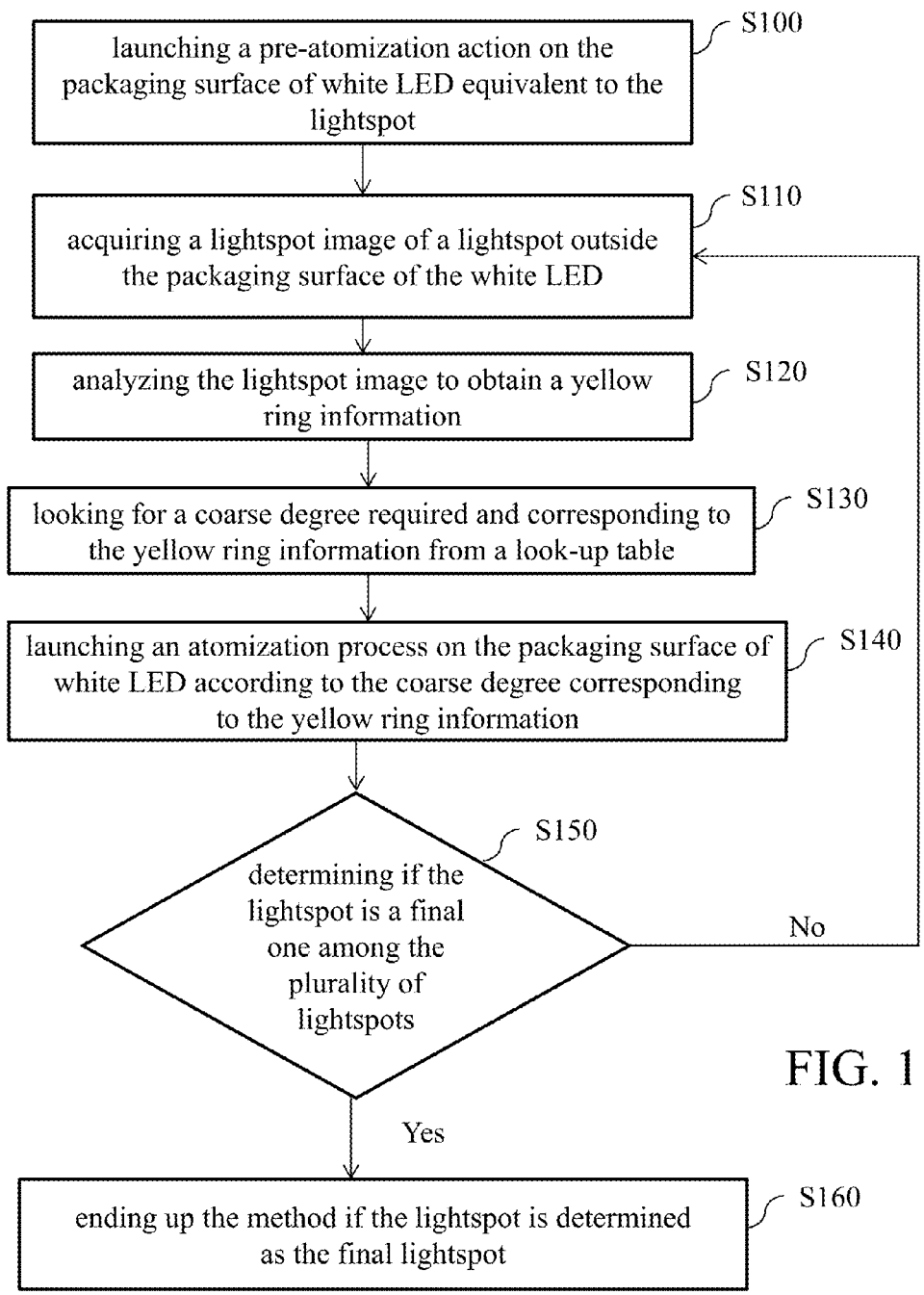
FIG. 1 is a main process flowchart for describing a method for eliminating yellow ring occurring on a white light emitting diode (LED) having a blue light chip exciting yellow phosphor powders and having a packaging surface enclosing thereon according to the present invention.

Referring to FIG. 1, a process flowchart for describing a method for eliminating yellow ring occurring on a white light emitting diode (LED) having a blue light chip exciting yellow phosphor powders and having a packaging surface enclosing thereon according to the present invention is shown therein.

The method comprises the following steps and will be described in details below.

At first, a lightspot image of a lightspot outside the packaging surface of the white LED is acquired (S110) for analyzing the yellow ring phenomenon.

Then, the yellow ring index for the lightspot is analyzed (S120) and the lightspot image is generated. In this manner, the generated lightspot image may be serving as a reference for recognizing and eliminating the yellow ring, which is right the purpose of the present invention.

Next, a coarse degree required and corresponding to the lightspot image is looked for in a look-up table. The look-up table has a relationship between a plurality of lightspot images and a plurality of coarse degrees corresponding thereto (S130). That is, a lightspot image has a corresponding coarse degree in the look-up table.

Subsequently, an atomization process is launched on the packaging surface of white LED according to the coarse degree corresponding to the lightspot image as found in the look-up table (S140). After the atomization is applied on the packaging surface of white LED, the yellow ring associated with the lightspot is eliminated. In an embodiment, the atomization process is enabled by a laser. The coarse degree associated with the atomization action is adjustable by controlling a scanning speed and energy of the laser. And the look-up table is established based on an experiment process with respect to such white LED.

Then, if the lightspot is a final one among the plurality of lightspots is determined (S150). If yes, the method is ended up (S160). Otherwise, the lightspot is an intermediate lightspot, one other than the final one, among the plurality of lightspots, the method goes back to step S110 with respect to a next one among the plurality of lightspots.

Figure 2:
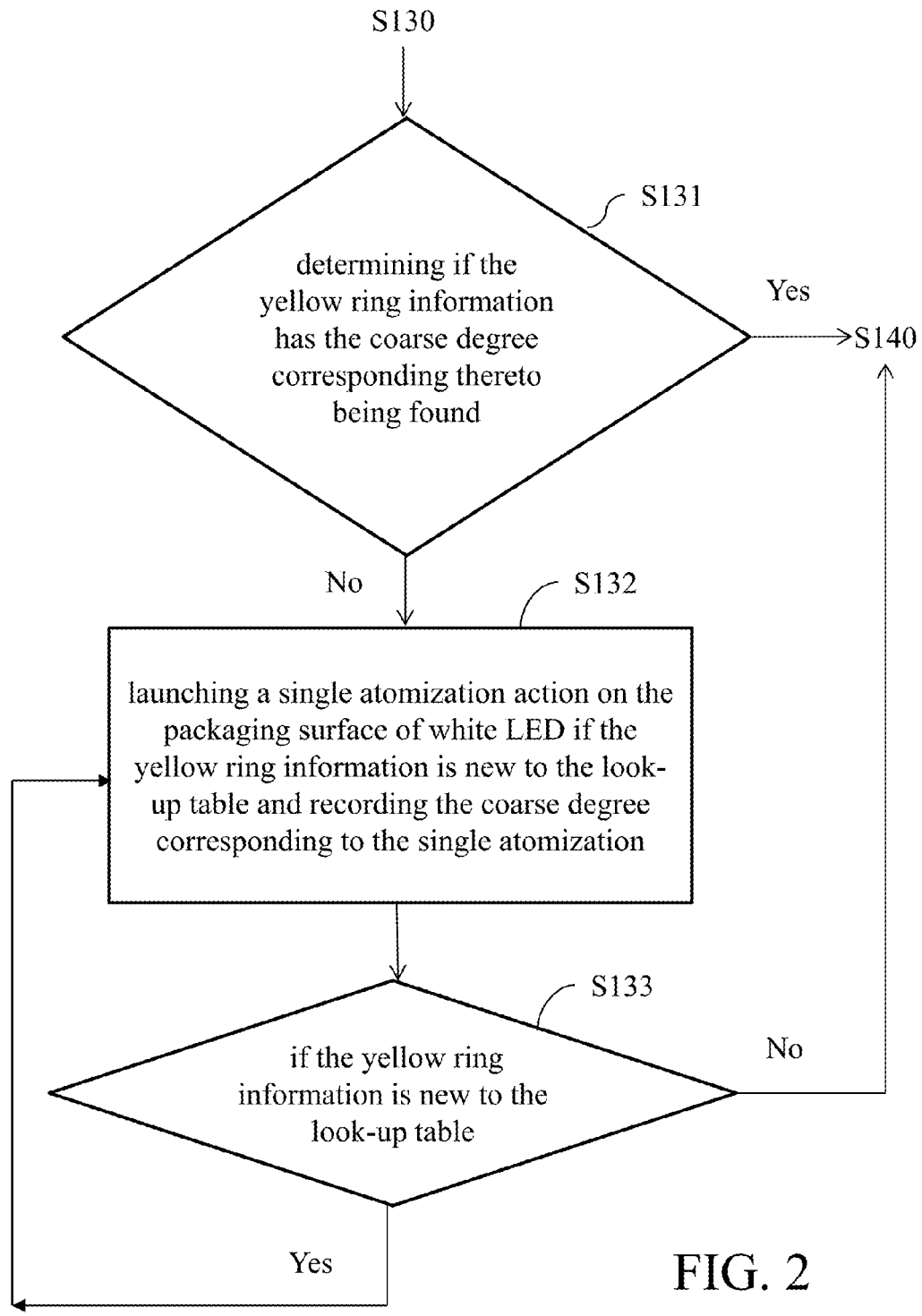
FIG. 2 is a sub-process flowchart associated with the method as shown in FIG. 1.
Figure 3:
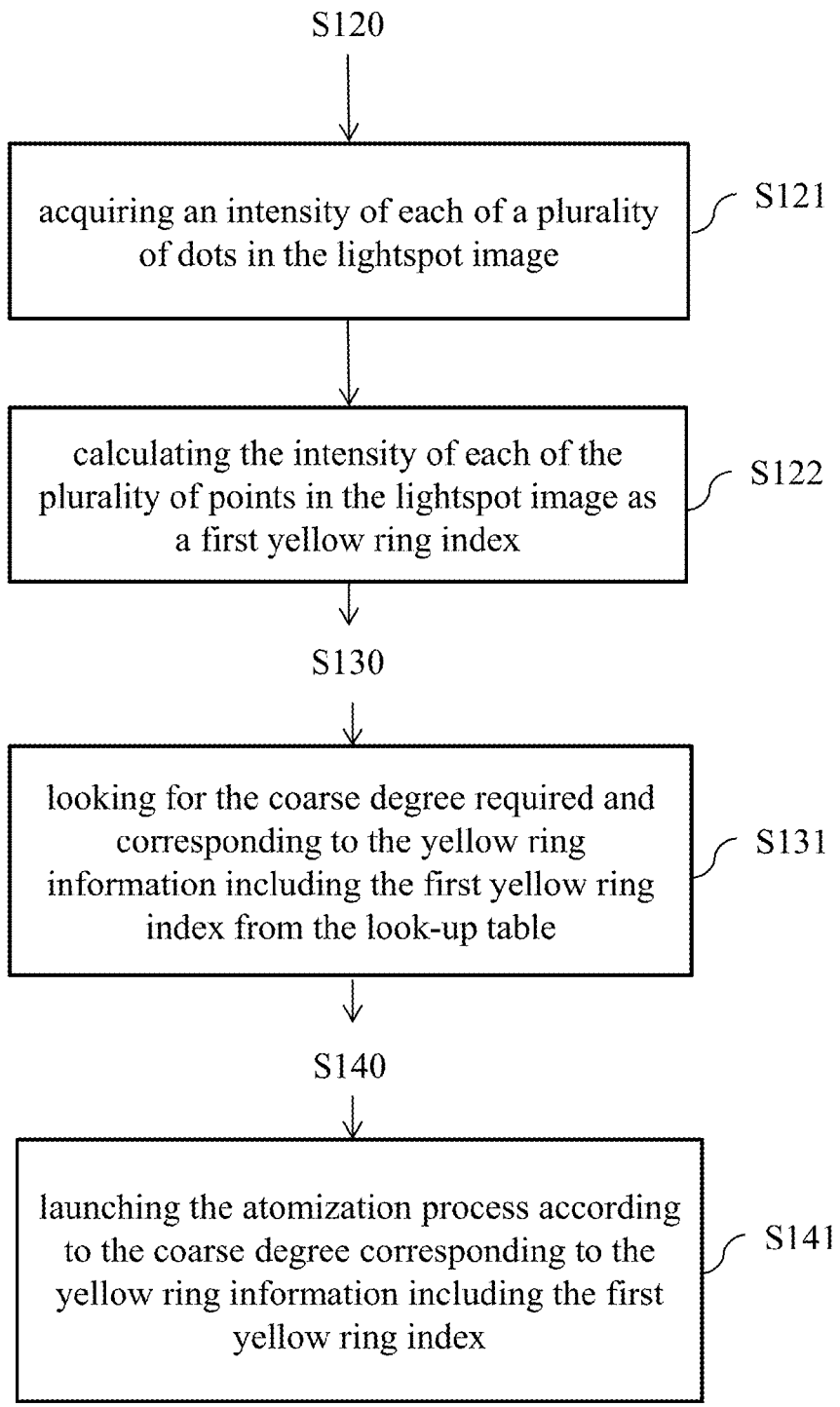
FIG. 3 is a sub-process flowchart associated with the method as shown in FIG. 1.
Figure 4:
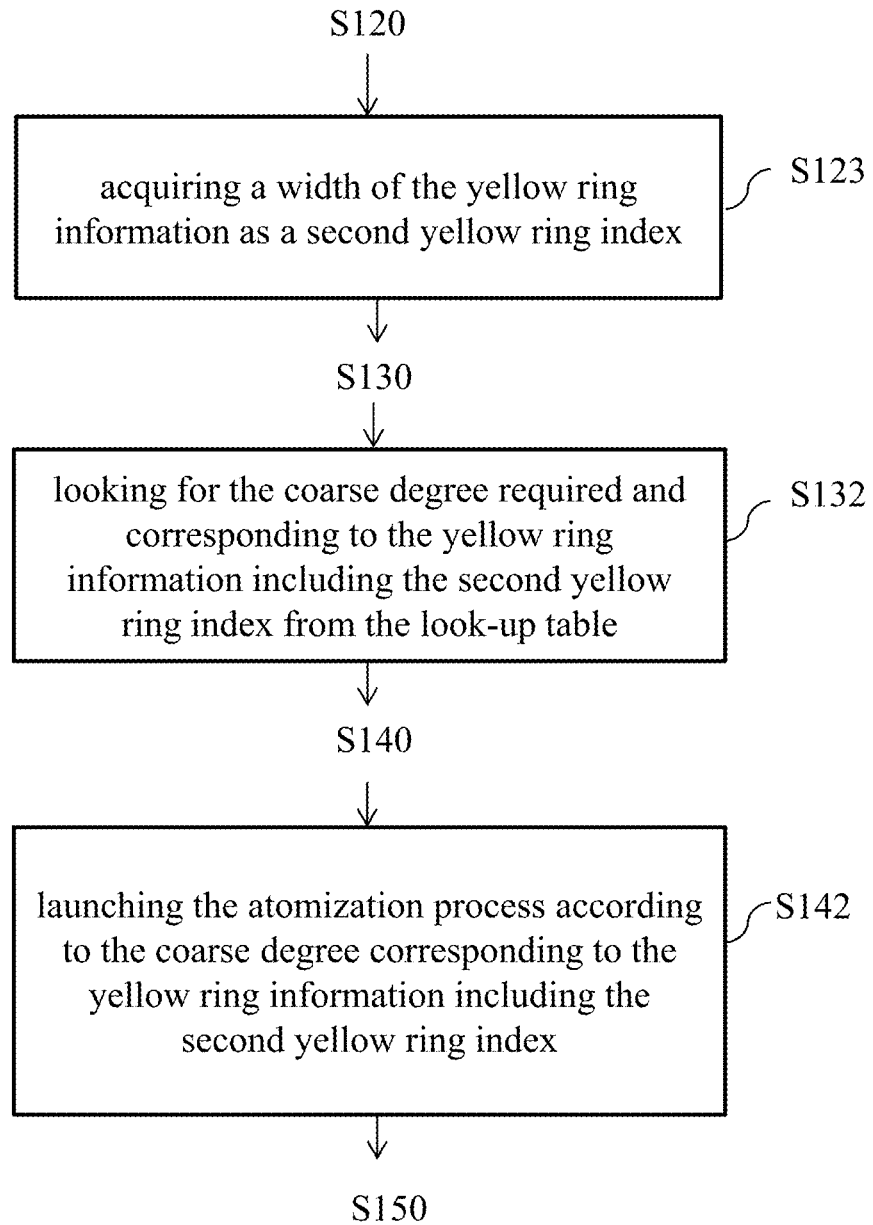
FIG. 4 is a sub-process flowchart associated with the method as shown in FIG. 1.

In an embodiment, the plurality of lightspot images and the plurality of coarse degree corresponding thereto are all null in the look-up table at the first beginning of the method performed. In this situation, the step (S130) further comprises the following steps, which may be referred to FIG. 2.

Then, if the lightspot image has the coarse degree corresponding thereto being found in the look-up table is determined (S131). If yes, the method continues to the step (S140).

Subsequently, if the lightspot image is new to the look-up table, a single atomization action on the packaging surface of white LED is launched and the coarse degree corresponding to the single atomization is recorded (S132). Then, if the current lightspot image is still new to the look-up table is determined (S133). If yes, the method goes back to the step (S132) for atomizing the packaging surface of white LED one more time. Otherwise, the coarse degree corresponding to the current the method goes to the step (140). In the step (S132), the atomization degree presented on the lightspot after the single atomization is accumulated in the repeating process.

Next, if the lightspot image is found with the coarse degree corresponding thereto, the step (S140) is performed. The lightspot image and a total coarse degree accumulated from the one or more times of single atomization actions as performed as a relationship pair are recorded into the look-up table as a future look-up table.

In an embodiment, a step is further comprised before the step (S110). It is to launch a pre-atomization action on the packaging surface of white LED, which is right the lightspot in the step (S100). This is done before a lightspot image with respect to the lightspot is acquired and analyzed, different from that described in the above, in which the atomization process is performed after the lightspot image is acquired and analyzed. But, in some sense, these two policies are equivalent since even a pre-atomization is performed, the yellow ring elimination task still requires a lightspot image analysis process to realize how to be processed with the lightspot on the packaging surface of the white LED, so that the yellow ring may be accurately eliminated.

In an embodiment, the step (S120) further comprises the following steps.

In the lightspot image, there is a plurality of dots and an intensity of each of the dots is acquired (S121). In an embodiment, the intensity of each of the plurality of dots in the lightspot image is calculated as a first yellow ring index (S122). Analogously, the step (S130) further comprises a step of looking for the coarse degree required and corresponding to the yellow ring information including the first yellow ring index from the look-up table (S131). The step (S140) further comprises a step of launching the atomization process according to the coarse degree corresponding to the yellow ring information including the first yellow ring index (S141).

In an embodiment, the lightspot image in the step (S120) further comprises a step of acquiring a width of the lightspot image as a second yellow ring index (S123). Analogously, the step (S130) further comprises a step of looking for the coarse degree required and corresponding to the yellow ring information including the second yellow ring index from the look-up table (S132). The step (S140) further comprises a step of launching the atomization process according to the coarse degree corresponding to the yellow ring information including the second yellow ring index (S142).

In an embodiment, the first and second yellow ring indexes are both contained in the yellow ring information.

In the above, the laser can control the obtained coarse degree made by each atomization action by adjusting its scanning speed and energy.

In the above, the look-up table is established in advanced by an experiment process with respect to such white LED.

Figure 5:
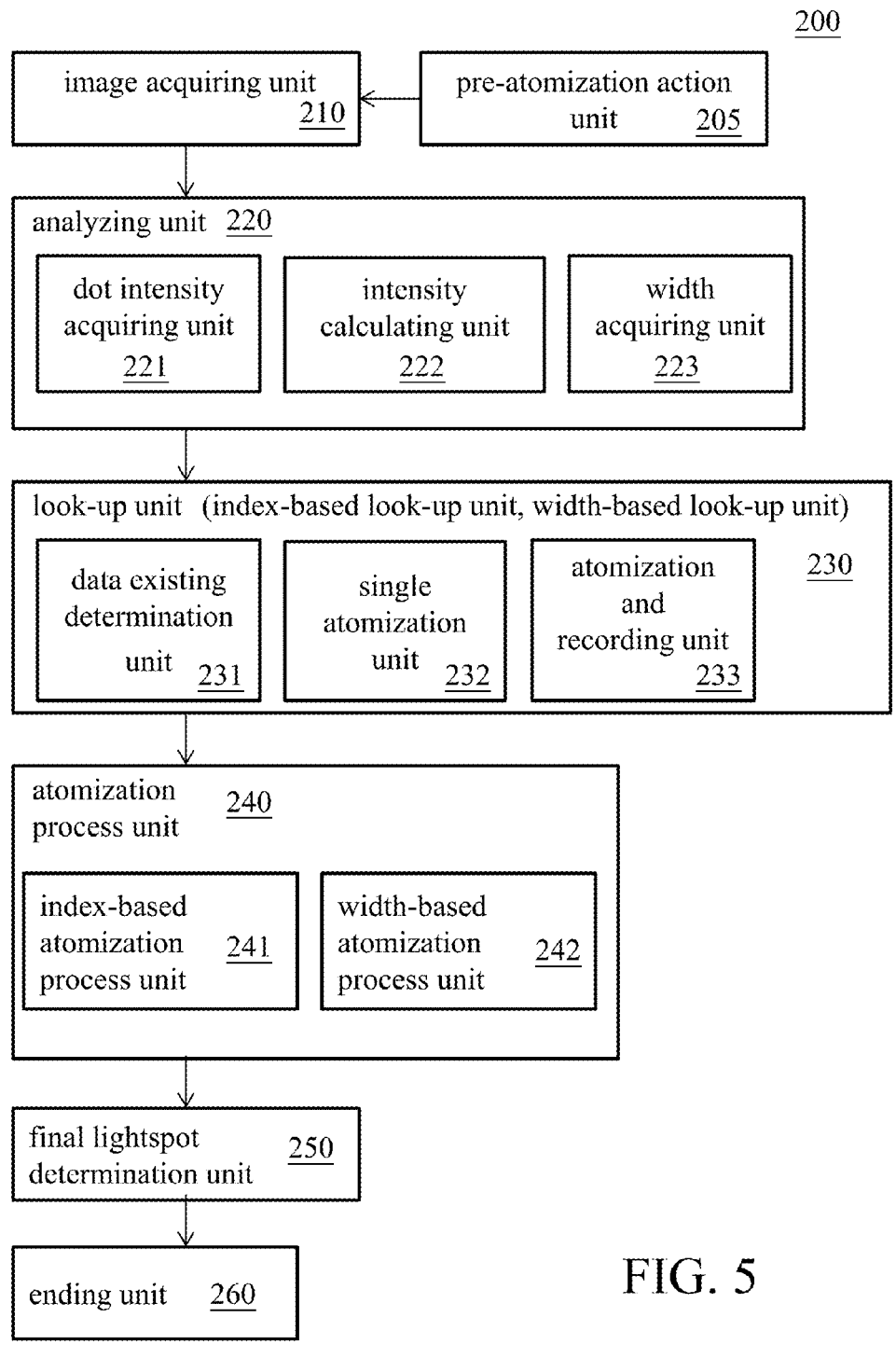
FIG. 5 is a block diagram for describing a system for eliminating yellow ring occurring on the white LED having the blue light chip exciting the yellow phosphor powders and having a packaging surface enclosing thereon according to the present invention.

Referring now to FIG. 5, it is a block diagram for describing a system for eliminating yellow ring occurring on the white LED having the blue light chip exciting the yellow phosphor powders and having a packaging surface enclosing thereon according to the present invention.

The system comprises an image acquiring unit 210, an analyzing unit 220, a look-up unit 230, an atomization process unit 240, a final lightspot determination unit 250, and an ending unit 260.

At first, the image acquiring unit 210 is used to acquire a lightspot image of one of the plurality of lightspots outside the packaging surface of the white LED. Next, the analyzing unit 220 is used to analyze the yellow ring of the lightspot image, so that the analyzed image may indicate how the yellow ring phenomenon is.

Then, the look-up unit 230 is used to look for a coarse degree required and corresponding to the lightspot image from a look-up table. In the look-up table, a relationship between the lightspot image and a coarse degree associated with the lightspot is recorded therein. So, the required coarse degree of the lightspot can be found. Similarly, relationships between a plurality of lightspot images and coarse degrees corresponding thereto can be obtained from the look-up table.

The atomization process unit 240 is used to launch an atomization process on the packaging surface of white LED according to the coarse degree obtained in the look-up table unit 230, as described above.

The final lightspot determination unit 250 is used to determine if the lightspot is a final one among the plurality of lightspots and direct the image acquiring unit 210 to acquire the lightspot image with respect to a next one among the plurality of lightspots, if the lightspot is determined as being not a final lightspot. Otherwise, the final lightspot determination unit 250 directs the ending unit 260 to end up the entire yellow ring elimination task, if the lightspot is determined as being the final lightspot.

In an embodiment, the plurality of lightspot images and the plurality of coarse degree corresponding thereto are all null in the look-up table. That is, the look-up table is empty originally and needs to be filled in the yellow ring elimination task. However, the filled information may be used at the same time when the present yellow ring elimination task is conducted.

In the above embodiment, the look-up unit 230 further comprises a data existing determination unit 231, a single atomization unit 232, and a recording unit 233. The data existing determination unit 231 is used to determine if the lightspot image has the coarse degree corresponding thereto being found in the look-up table or the lightspot image is new to the look-up table. Further, if the lightspot image is found with the coarse degree corresponding thereto, the automization process unit 240 is directed to perform the automization process having the automization times according to the coarse degree found. If the lightspot image is new to the look-up table, i.e. no coarse degree information corresponding to the lightspot image is found in the look-up table, the single atomization unit 232 launches a single atomization action on the packaging surface of white LED and the recording unit 233 records the obtained coarse degree corresponding to the single atomization into the look-up table. At this time, the single automization action is conducted to see if one time of single automization may have the obtained coarse degree existing in the look-up table. If the coarse degree is found in the look-up table, it is indicated that the single automization action has made the yellow ring of the lightspot eliminated. At this time, the analyzing unit 220 is directed to work for the next lightspot. Otherwise, the single automization unit 232 works again on the same lightspot. And the accumulated coarse degree amount is recorded by the recording unit 233. Until the accumulated coarse degree is found in the look-up table, the automization process unit 240 is directed to work according to the accumulated coarse degree recorded in the recording unit 233. At this time, the automization for yellow ring elimination has been finished, and so the image acquiring unit 210 is directed to work for the next lightspot.

In an embodiment, the system further comprises a pre-atomization action unit 205, which launches a pre-atomization action on the packaging surface of white LED before the lightspot is acquired with its lightspot image. Description about this, the method of the present invention explained in the above may be referred to. In some sense, these two policies are equivalent since even a pre-atomization is performed, the yellow ring elimination task still requires a lightspot image analysis process to realize how to be processed with the lightspot on the packaging surface of the white LED, so that the yellow ring may be accurately eliminated.

In an embodiment, the analyzing unit 220 further comprises a dot intensity acquiring unit 221 and an intensity calculating unit 222. The dot intensity acquiring unit 221 acquires an intensity of each of a plurality of dots in the lightspot image. The intensity calculating unit 222 calculates the intensity of each of the plurality of dots in the lightspot image as a first yellow ring index. At the same time, the look-up unit 230 is an index-based look-up unit 230, which looks for the coarse degree required and corresponding to the yellow ring information including the first yellow ring index from the look-up table. The atomization process unit 240 further comprises a width-based atomization process unit 241, which launches the atomization process according to the coarse degree corresponding to the yellow ring information and the second yellow ring index.

In an embodiment, the analyzing unit 220 further comprises a width acquiring unit 223, which acquires a width of the lightspot image as a second yellow ring index. At the same time, the look-up unit 230 is a width-based look-up unit 230, which looks for the coarse degree required and corresponding to the yellow ring information including the second yellow ring index from the look-up table. The atomization process unit 240 further comprises a width-based atomization process unit 242, which launches the atomization process according to the coarse degree corresponding to the yellow ring information and the second yellow ring index.

The atomization action and process are both enabled by a laser, and the coarse degree associated with the atomization action is adjustable by controlling a scanning speed and energy of the laser. The look-up table is established based on an experiment process.

Figure 6:
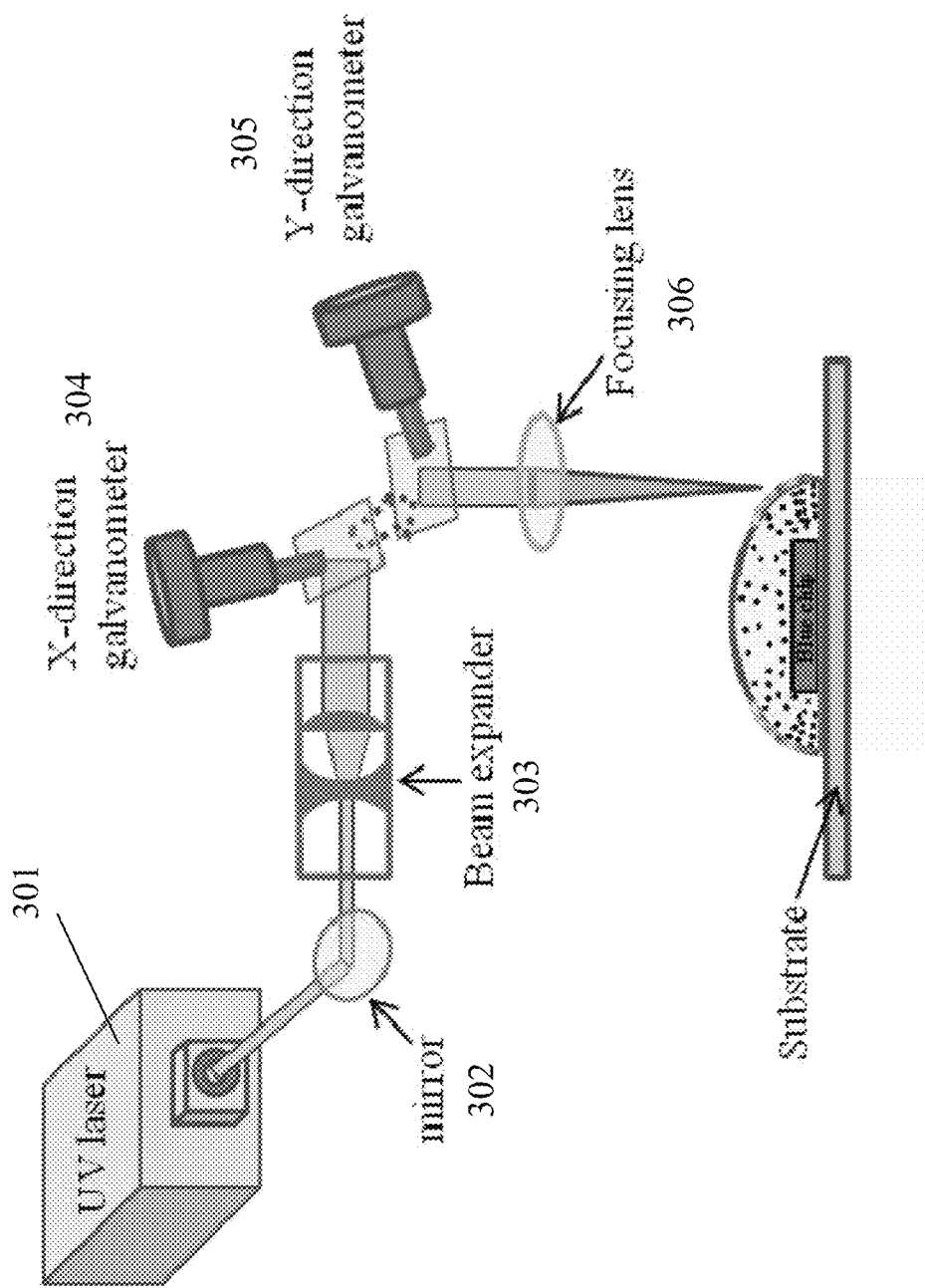
FIG. 6 is a schematic diagram of an atomization apparatus used in the present invention.

Referring to FIG. 6, a schematic diagram of an atomization apparatus used in the present invention is shown therein. A UV laser 301 provides a laser light. A mirror 302 is used to direct the laser light to a desired direction. A beam expander 303 is used to expand the laser light. An X- and Y-direction galvanometers 304, 305 arranged as being in perpendicular to each other are used to subsequently guide the laser light to project on a work plane. The galvanometers 304, 305 may be controlled by a respective voltage to have a small range of rotation, about ±20°, and may correspondingly cause the laser light reflected thereby to have an X and Y-directional translations, respectively. Since the laser light may be moved in both X and Y directions, laser light scanning on the packaging surface of the white LED may be achieved. Finally, a focusing lens 306 is used to focus the laser light directed from the X- and Y-direction galvanometers 304, 305 onto a packaging surface of white LED chip 306 of such kind mentioned for the present invention.

The laser may have a scanning area and a particular pattern, which may be designed by software. The energy value of the laser light source and the scanning speed of the galvanometers may also be controlled by software. A focusing point of the laser light source may be adjusted by a stepping motor, making a scanning action required for the whole atomization of the packaging surface of the white LED along Z axle possible.

Figure 7:
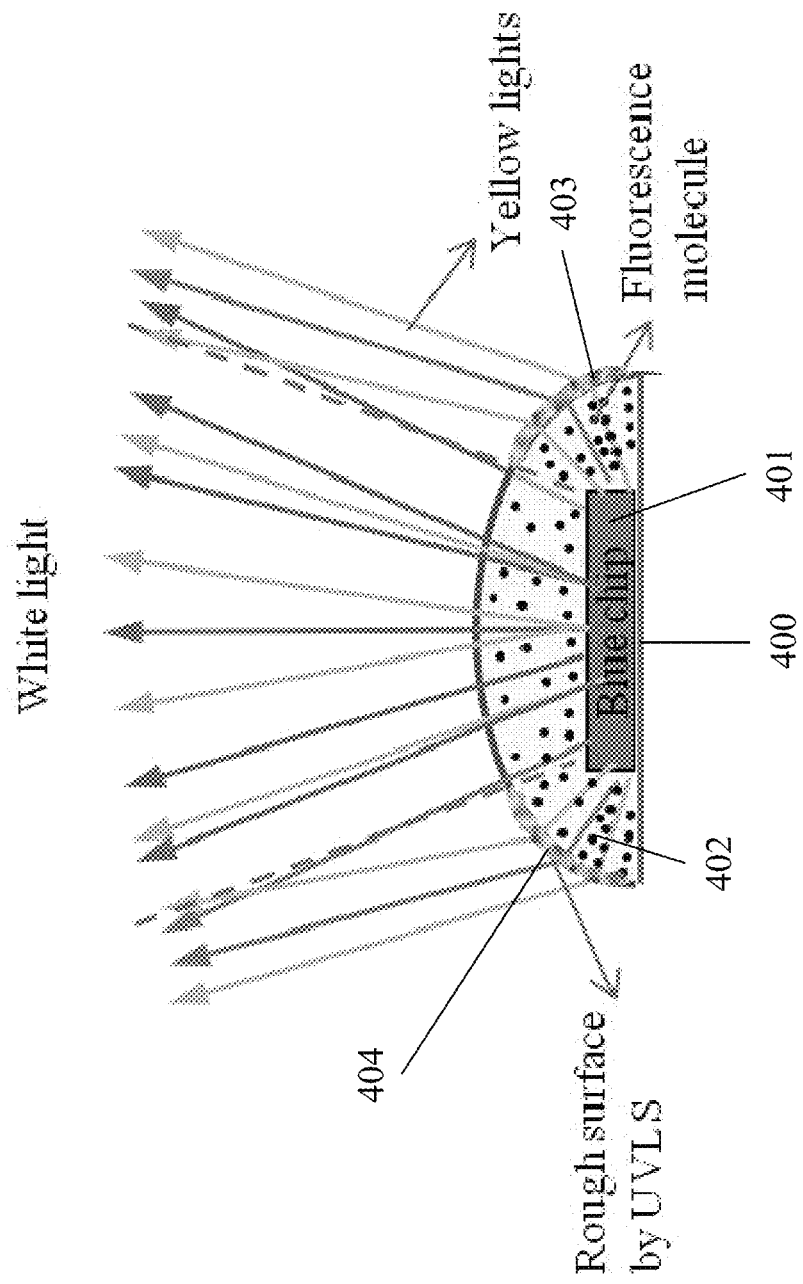
FIG. 7 is a schematic diagram of the white LED at a lighting state when it has been atomized at the right and left portions of its packaging surface according to the present invention, in which the outgoing light is further mixed at the rough right and left packaging surface portions.

Referring to FIG. 7, a schematic diagram of the white LED at a lighting state when it has been atomized at the right and left portions of its packaging surface according to the present invention are shown therein. As shown, the white LED 400 is composed of a blue light chip 401 and yellow phosphor powders 402, in which the yellow phosphor powders 402 are shown as not uniform. Since the proceeding directions of the yellow light rays from the white LED 400 at the right and left packaging surface portions 403, 404 are changed, it may be realized how the outgoing light rays are further mixed by the rough right and left packaging surface portions 403, 404, and thus how the yellow ring phenomenon is eliminated.

In addition, it is readily to be known that this yellow ring elimination can be easily modified as being suitable to the case where the blue light chip excites red and green phosphor powders. Further, the method and system of acquiring an image of a light from a white LED of the same kind enclosed in a packaging surface are also applicable to other lighting devices with the similar packaging surface.

In view of the above, the method and system of the present invention at least provide the following advantages: (1) capable of providing a service for the manufacturers whoever desire to eliminate the yellow ring phenomenon of their white LED products, respectively; (2) capable of providing a reduced cost in elimination of the yellow ring phenomenon, as compared to the implementation of the conventional secondary optical elements; (3) capable of being suitable for all kinds of white LED products; and (4) capable of having a complete effect in a yellow ring elimination task.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. A method of for eliminating a yellow ring phenomenon occurring on a plurality of lightspots of a white light emitting diode (LED) having a blue light chip exciting a plurality of yellow phosphor powders and having a packaging surface thereon, comprising steps of:
   (a) acquiring a lightspot image of a lightspot outside the packaging surface of the white LED;
   (b) analyzing the lightspot image to obtain a yellow ring information;
   (c) looking for a coarse degree required and corresponding to the yellow ring information from a look-up table having a relationship between a plurality of yellow ring information and a plurality of coarse degrees corresponding thereto;
   (d) launching an atomization process on the packaging surface of white LED according to the coarse degree corresponding to the yellow ring information; and
   (e) determining if the lightspot is a final one among the plurality of lightspots, and going back to step (a) with respect to a next one among the plurality of lightspots if the lightspot is determined as an intermediate lightspot; and
   (f) ending up the method if the lightspot is determined as the final lightspot.

2. The method as claimed in claim 1, wherein the plurality of lightspot images and the plurality of coarse degree corresponding thereto are all null in the look-up table, and the step (c) further comprises steps of:
   determining if the yellow ring information has the coarse degree corresponding thereto being found or if the yellow ring information is new to the look-up table;
   continuing the method to the step (d) if the yellow ring information is found with the coarse degree corresponding thereto;
   launching a single atomization action on the packaging surface of white LED if the yellow ring information is new to the look-up table and recording the coarse degree corresponding to the single atomization;
   going back to the step (b) if the lightspot image is still new to the look-up table;
   performing the step (d) if the lightspot image is found with the coarse degree corresponding thereto and recording the yellow ring information and a total coarse degree accumulated from the one or more times of single atomization actions as performed as a relationship pair into the look-up table.

3. The method as claimed in claim 1, further comprising a step (a1) before the step (a) of:
   launching a pre-atomization action on the packaging surface of white LED equivalent to the lightspot in the step (a).

4. The method as claimed in claim 1, wherein:
   the step (b) further comprises steps of:
   acquiring an intensity of each of a plurality of dots in the lightspot image; and
   calculating the intensity of each of the plurality of points in the lightspot image as a first yellow ring index;
   the step (c) further comprises a step of looking for the coarse degree required and corresponding to the yellow ring information including the first yellow ring index from the look-up table; and
   the step (d) further comprises a step of launching the atomization process according to the coarse degree corresponding to the yellow ring information including the first yellow ring index.

5. The method as claimed in claim 1, wherein:
   the step (b) further comprises a step of acquiring a width of the yellow ring information as a second yellow ring index;
   the step (c) further comprises a step of looking for the coarse degree required and corresponding to the yellow ring information including the second yellow ring index from the look-up table; and
   the step (d) further comprises a step of launching the atomization process according to the coarse degree corresponding to the yellow ring information including the second yellow ring index.

6. The method as claimed in claim 1, wherein the atomization action and process are each enabled by a laser, and the coarse degree associated with the atomization action is adjustable by controlling a scanning speed and an energy of the laser.

7. The method as claimed in claim 6, wherein the laser has a focusing point controlled by a stepping motor.

8. The method as claimed in claim 1, wherein the look-up table is established based on an experiment process.

9. A system for eliminating a yellow ring phenomenon occurring on a plurality of lightspots of a white light emitting diode (LED) having a blue light chip exciting a plurality of yellow phosphor powders and having a packaging surface thereon, comprising:
   an image acquiring unit, acquiring a lightspot image of one of the plurality of lightspots outside the packaging surface of the white LED;
   an analyzing unit, analyzing the lightspot image to obtain a yellow ring information;
   a look-up unit, looking for a coarse degree required and corresponding to the yellow ring information from a look-up table having a relationship between a plurality of yellow ring information and coarse degrees corresponding thereto;
   an atomization process unit, launching an atomization process on the packaging surface of white LED according to the coarse degree corresponding to the yellow ring information;

a final lightspot determination unit, determining if the lightspot is a final one among the plurality of lightspots and directing the image acquiring unit to acquire the yellow ring information with respect to a next one among the plurality of lightspots if the lightspot is determined as an intermediate lightspot; and an end-up unit, ending up the method if the lightspot is determined as the final lightspot.

10. The system as claimed in claim 9, wherein the plurality of yellow ring information and the plurality of coarse degree corresponding thereto are all null in the look-up table, and the look-up unit further comprises:

a data existing determination unit, determining if the lightspot image has the coarse degree corresponding thereto being found or if the yellow ring information is new to the look-up table, and directing the final lightspot determination unit to determine if the lightspot is the final lightspot if the lightspot image is found with the coarse degree corresponding thereto;

a single atomization unit, launching a single atomization action on the lightspot if the yellow ring information is new to the look-up table and recording the coarse degree corresponding to the single atomization, while directing the analyzing unit to analyze the lightspot image if the yellow ring information is still new to the look-up table; and an atomization and recording unit, directing the atomization process unit to launch the atomization process if the yellow ring information is found with the coarse degree corresponding thereto and recording the yellow ring information and a total coarse degree accumulated from the one or more times of single atomization actions as performed as a relationship pair into the look-up table.

11. The system as claimed in claim 9, further comprising a pre-atomization action unit, launching a pre-atomization action on the packaging surface of white LED equivalent to the lightspot in the image acquiring unit.

12. The system as claimed in claim 9, wherein:

the analyzing unit further comprises a dot intensity acquiring unit, acquiring an intensity of each of a plurality of dots in the lightspot image, and an intensity calculating unit, calculating the intensity of each of the plurality of dots in the lightspot image as a first yellow ring index;

the look-up unit further comprises an index-based look-up unit, looking for the coarse degree required and corresponding to the yellow ring information having the first yellow ring index from the look-up table; and the atomization process unit further comprises a index-based atomization process unit, launching the atomization process according to the coarse degree corresponding to the yellow ring information including the first yellow ring index.

13. The system as claimed in claim 9, wherein:

the analyzing unit further comprises a width acquiring unit, acquiring a width of the lightspot image as a second yellow ring index; and the look-up unit further comprises a width-based look-up unit, looking for the coarse degree required and corresponding to the yellow ring information having the second yellow ring index from the look-up table; and the atomization process unit further comprises a width-based atomization process unit, launching the atomization process according to the coarse degree corresponding to the yellow ring information including the second yellow ring index.

14. The system as claimed in claim 9, wherein the atomization action and process are each enabled by a laser, and the coarse degree associated with the atomization action is adjustable by controlling a scanning speed and an energy of the laser.

15. The method as claimed in claim 14, wherein the laser has a focusing point controlled by a stepping motor.

16. The method as claimed in claim 9, wherein the look-up table is established based on an experiment process.

* * * * *